United States Patent
Hata et al.

(10) Patent No.: US 8,660,162 B2
(45) Date of Patent: Feb. 25, 2014

(54) SEMICONDUCTOR LASER APPARATUS AND OPTICAL APPARATUS

(75) Inventors: Masayuki Hata, Takatsuki (JP); Hideki Yoshikawa, Takarazuka (JP)

(73) Assignee: Sanyo Electric Co., Ltd., Moriguchi-shi (JP)

(*) Notice: Subject to any disclaimer, the term of this patent is extended or adjusted under 35 U.S.C. 154(b) by 143 days.

(21) Appl. No.: 13/189,637

(22) Filed: Jul. 25, 2011

(65) Prior Publication Data
US 2012/0027040 A1   Feb. 2, 2012

(30) Foreign Application Priority Data
Jul. 30, 2010   (JP) .................................. 2010-172376

(51) Int. Cl.
*H01S 5/00*   (2006.01)

(52) U.S. Cl.
USPC ................................. 372/50.121; 372/50.122

(58) Field of Classification Search
USPC ........................................ 372/50.121, 50.122
See application file for complete search history.

(56) References Cited

U.S. PATENT DOCUMENTS

| | | | |
|---|---|---|---|
| 5,557,116 A | 9/1996 | Masui et al. | |
| 6,115,398 A * | 9/2000 | Jiang ........................... | 372/50.21 |
| 6,808,316 B2 | 10/2004 | Nakanishi et al. | |
| 6,829,265 B2 | 12/2004 | Nakatsuka et al. | |
| 7,113,528 B2 | 9/2006 | Miyabe et al. | |
| 7,217,955 B2 | 5/2007 | Hamaoka et al. | |
| 7,376,166 B2 | 5/2008 | Hata et al. | |
| 7,724,798 B2 | 5/2010 | Watanabe et al. | |
| 2004/0091006 A1* | 5/2004 | Nishiyama et al. ............. | 372/36 |
| 2005/0074046 A1* | 4/2005 | Kasai ................. | 372/50 |
| 2005/0082550 A1* | 4/2005 | Hamaoka et al. ............... | 257/80 |
| 2009/0161336 A1 | 6/2009 | Watanabe et al. | |
| 2009/0161718 A1 | 6/2009 | Watanabe et al. | |
| 2010/0079359 A1 | 4/2010 | Kunoh et al. | |
| 2010/0080001 A1 | 4/2010 | Kunoh et al. | |
| 2010/0284433 A1 | 11/2010 | Hata et al. | |
| 2010/0290498 A1 | 11/2010 | Hata et al. | |

(Continued)

FOREIGN PATENT DOCUMENTS

| | | | |
|---|---|---|---|
| JP | S62-069693 A | 3/1987 | |
| JP | H06-314847 A | 11/1994 | |

(Continued)

OTHER PUBLICATIONS

Written Opinion of the International Searching Authority dated Sep. 25, 2012.

*Primary Examiner* — Tod T Van Roy
*Assistant Examiner* — Marcia Golub-Miller
(74) *Attorney, Agent, or Firm* — Marvin A. Motsenbocker; Mots Law, PLLC

(57) ABSTRACT

In this semiconductor laser apparatus, a first wire-bonding portion is arranged at a position in a fourth direction from a first semiconductor laser device and in a first direction from a photodetector, and a second wire-bonding portion is arranged at a position in the fourth direction from the first semiconductor laser device and in a third direction from the first wire-bonding portion. A third wire-bonding portion is arranged at a position in a second direction from a third semiconductor laser device and in the first direction from the photodetector, and a fourth wire-bonding portion is arranged at a position in the second direction from the third semiconductor laser device and in the third direction from the third wire-bonding portion.

20 Claims, 4 Drawing Sheets

(56) References Cited

U.S. PATENT DOCUMENTS

| | | | |
|---|---|---|---|
| 2011/0280266 A1* | 11/2011 | Hayashi et al. | 372/43.01 |
| 2011/0280267 A1* | 11/2011 | Yoshikawa et al. | 372/44.01 |
| 2011/0280270 A1* | 11/2011 | Hayashi | 372/50.1 |
| 2012/0106584 A1* | 5/2012 | Katsuki et al. | 372/50.12 |

FOREIGN PATENT DOCUMENTS

| | | |
|---|---|---|
| JP | 2002-344061 A | 11/2002 |
| JP | 2003-121707 A | 4/2003 |
| JP | 2004-055744 A | 2/2004 |
| JP | 2005-150692 A | 6/2005 |
| JP | 2006-269987 A | 10/2006 |
| JP | 2007-318075 A | 12/2007 |
| JP | 2008-016715 A | 1/2008 |
| JP | 2008-021754 A | 1/2008 |
| JP | 2008-198640 A | 8/2008 |
| JP | 2008-300714 A | 12/2008 |
| JP | 2009-044026 A | 2/2009 |
| JP | 2010-166036 A | 7/2010 |
| WO | 2005/039001 A1 | 4/2005 |

* cited by examiner

SEMICONDUCTOR LASER APPARATUS AND OPTICAL APPARATUS

CROSS-REFERENCE TO RELATED APPLICATION

The priority application number JP2010-172376, Semiconductor Laser Apparatus and Optical Apparatus, Jul. 30, 2010, Masayuki Hata et al., upon which this patent application is based is hereby incorporated by reference.

BACKGROUND OF THE INVENTION

1. Field of the Invention

The present invention relates to a semiconductor laser apparatus and an optical apparatus, and more particularly, it relates to a semiconductor laser apparatus and an optical apparatus each comprising a plurality of semiconductor laser devices.

2. Description of the Background Art

A semiconductor laser apparatus comprising a plurality of semiconductor laser devices is known in general, as disclosed in International Patent Laying-Open No. WO2005/039001, for example.

International Patent Laying-Open No. WO2005/039001 discloses a two-beam semiconductor laser apparatus comprising a submount (base) and a two-wavelength semiconductor laser device fixed onto an upper surface of the submount on a front side such that a laser emitting facet faces the front side. In this semiconductor laser apparatus, a photodetector monitoring intensity of a laser beam is provided behind the two-wavelength semiconductor laser device on the submount. The two-wavelength semiconductor laser device is connected with a lead terminal through a wire bonded to a pad electrode arranged on the submount on a side of the two-wavelength semiconductor laser device.

In the two-beam semiconductor laser apparatus disclosed in International Patent Laying-Open No. WO2005/039001, a three-wavelength semiconductor laser device having three semiconductor laser devices arranged laterally, for example, is conceivably fixed onto the submount in order to further increase a light-emitting point. In this case, the central semiconductor laser device is conceivably connected to a lead terminal through a wire bonded to an electrode arranged behind the semiconductor laser device. However, the photodetector is provided behind the central semiconductor laser device, and hence a laser beam emitted from the central semiconductor laser device for monitoring may be blocked by the wire. Thus, the photodetector cannot accurately detect intensity of the laser beam from the central semiconductor laser device.

SUMMARY OF THE INVENTION

A semiconductor laser apparatus according to a first aspect of the present invention comprises a base having a first electrode with a first wire-bonding portion, a second electrode with a second wire-bonding portion, a third electrode with a third wire-bonding portion and a fourth electrode with a fourth wire-bonding portion arranged on an upper surface of the base, a first semiconductor laser device, a second semiconductor laser device, a third semiconductor laser device and a photodetector arranged on the upper surface, and a first lead terminal, a second lead terminal, a third lead terminal, a fourth lead terminal and a fifth lead terminal, wherein the first semiconductor laser device, the second semiconductor laser device and the third semiconductor laser device emit respective laser beams in a first direction, the first lead terminal, the second lead terminal, the fifth lead terminal, the third lead terminal and the fourth lead terminal extend in the first direction and are arranged in this order along a second direction orthogonal to the first direction, a first end of the fifth lead terminal in the first direction has a mounting portion for mounting the base, a third direction is opposite to the first direction, a fourth direction is opposite to the second direction, the first lead terminal, the second lead terminal, the third lead terminal and the fourth lead terminal are arranged at positions in the third direction from the mounting portion, a second end of the first lead terminal in the first direction has a fifth wire-bonding portion, a fourth end of the second lead terminal in the first direction has a sixth wire-bonding portion, a fifth end of the third lead terminal in the first direction has a seventh wire-bonding portion, a third end of the fourth lead terminal in the first direction has an eighth wire-bonding portion, one electrode of the first semiconductor laser device and a top surface of the photodetector are connected to the first electrode and the second electrode, respectively, one electrode of the second semiconductor laser device is connected to one electrode of the third electrode or the fourth electrode, one electrode of the third semiconductor laser device is connected to the other electrode of the third electrode or the fourth electrode, another electrode of the first semiconductor laser device, another electrode of the second semiconductor laser device, another electrode of the third semiconductor laser device and a lower surface of the photodetector are connected to the fifth lead terminal, the first wire-bonding portion is arranged at a position in the fourth direction from the first semiconductor laser device and in the first direction from the photodetector, the second wire-bonding portion is arranged at a position in the fourth direction from the first semiconductor laser device and in the third direction from the first wire-bonding portion, the third wire-bonding portion is arranged at a position in the second direction from the third semiconductor laser device and in the first direction from the photodetector, the fourth wire-bonding portion is arranged at a position in the second direction from the third semiconductor laser device and in the third direction from the third wire-bonding portion, the first wire-bonding portion is connected with the fifth wire-bonding portion through a first wire, the second wire-bonding portion is connected with the sixth wire-bonding portion through a second wire, the third wire-bonding portion is connected with the eighth wire-bonding portion through a third wire, and the fourth wire-bonding portion is connected with the seventh wire-bonding portion through a fourth wire.

In the semiconductor laser apparatus according to the first aspect of the present invention, the first wire-bonding portion is arranged at the position in the fourth direction opposite to the second direction from the first semiconductor laser device and in the first direction from the photodetector, the second wire-bonding portion is arranged at the position in the fourth direction from the first semiconductor laser device and in the third direction from the first wire-bonding portion, the third wire-bonding portion is arranged at the position in the second direction from the third semiconductor laser device and in the first direction from the photodetector, the fourth wire-bonding portion is arranged at the position in the second direction from the third semiconductor laser device and in the third direction from the third wire-bonding portion, the first wire-bonding portion is connected with the fifth wire-bonding portion through the first wire, the second wire-bonding portion is connected with the sixth wire-bonding portion through the second wire, the third wire-bonding portion is connected with the eighth wire-bonding portion through the third wire, and the fourth wire-bonding portion is connected with the seventh wire-bonding portion through the fourth wire. Thus, the wires do not block emitted laser beams for monitoring between the semiconductor laser devices and the photodetector. Thus, the photodetector can accurately detect intensity of laser beams from the semiconductor laser devices.

In the aforementioned semiconductor laser apparatus according to the first aspect, the second end is preferably bent toward the second lead terminal, and the third end is preferably bent toward the third lead terminal. According to this structure, the second end and the third end can further approach the second lead terminal and the third lead terminal to which the second end and the third end are adjacent, and hence a width in which the first to fifth lead terminals are arranged along the second direction can be further reduced.

In the aforementioned semiconductor laser apparatus according to the first aspect, the fifth wire-bonding portion is preferably located at a position in the first direction from the sixth wire-bonding portion, and the eighth wire-bonding portion is preferably located at a position in the first direction from the seventh wire-bonding portion. According to this structure, the fifth wire-bonding portion and the first wire-bonding portion approach each other, and hence a length of the first wire can be further reduced, dissimilarly to a case where the fifth wire-bonding portion and the sixth wire-bonding portion are provided at the same position in the first direction. Further, the eighth wire-bonding portion and the third wire-bonding portion approach each other, and hence a length of the third wire can be further reduced, dissimilarly to a case where the seventh wire-bonding portion and the eighth wire-bonding portion are provided at the same position in the first direction. Further, the lengths of the wires are short, and hence the wires can be easily bonded.

The aforementioned semiconductor laser apparatus according to the first aspect preferably further comprises a base portion retaining the first lead terminal, the second lead terminal, the third lead terminal, the fourth lead terminal and the fifth lead terminal. According to this structure, a plurality of the first to fifth lead terminals arranged along the second direction can be reliably fixed by the base portion.

In the aforementioned structure further comprising the base portion, the base portion preferably includes a recess portion in which the mounting portion is arranged. According to this structure, the base can be easily fixed onto the mounting portion in the recess portion.

In this case, on a bottom surface of the recess portion, the second end is preferably bent toward the second lead terminal, and on the bottom surface of the recess portion, the third end is preferably bent toward the third lead terminal. According to this structure, the second end and the third end are bent in the recess portion provided in the base portion, and hence a larger region of the fifth wire-bonding portion in the first lead terminal and a larger region of the eighth wire-bonding portion in the fourth lead terminal can be secured. Thus, a bonding position of the first wire on the fifth wire-bonding portion can be easily deviated in the fourth direction from a bonding position of the second wire on the sixth wire-bonding portion. Further, a bonding position of the third wire on the eighth wire-bonding portion can be easily deviated in the second direction from a bonding position of the fourth wire on the seventh wire-bonding portion.

In the aforementioned structure in which the second end is bent toward the second lead terminal, and the third end is bent toward the third lead terminal, the fourth end and the fifth end are preferably bent toward the first end. According to this structure, the fourth end and the fifth end can be so arranged as to approach the first end, and hence the bonding position of the second wire on the sixth wire-bonding portion can be easily deviated in the second direction from the bonding position of the first wire on the fifth wire-bonding portion. Further, the bonding position of the fourth wire on the seventh wire-bonding portion can be easily deviated in the fourth direction from the bonding position of the third wire on the eighth wire-bonding portion.

In the aforementioned semiconductor laser apparatus according to the first aspect, the base preferably has a substantially rectangular shape in plan view, and the first wire-bonding portion, the second wire-bonding portion, the third wire-bonding portion and the fourth wire-bonding portion are preferably separately arranged in the vicinity of corners of the base. According to this structure, the first, second, third and fourth wire-bonding portions are separated from each other with respective intervals, and hence the first, second, third and fourth wires can be easily bonded. Further, the first, second, third and fourth wires can be easily inhibited from contact with each other.

In the aforementioned structure further comprising the base portion, a maximum width of the base portion in the second direction is preferably smaller than a maximum width from the first lead terminal to the fourth lead terminal in the second direction. According to this structure, intervals between the lead terminals can be increased without increasing the width of the base portion, and hence the lead terminals can be easily formed. Further, contact between the lead terminals can be inhibited. Further, the wire-bonding portions of the first to fourth lead terminals and the mounting portion of the fifth lead terminal can be easily formed on the base portion.

In the aforementioned structure further comprising the base portion, a maximum width of the base portion in the second direction is preferably larger than a maximum width from the first lead terminal to the fourth lead terminal in the second direction. According to this structure, the first lead terminal and the fourth lead terminal do not protrude outside side ends of the base portion in the second direction and the fourth direction. Therefore, this semiconductor laser apparatus can be easily built into a housing of an optical pickup or the like through an insertion hole or the like without contact of the lead terminals with an inner surface of the insertion hole.

In the aforementioned semiconductor laser apparatus according to the first aspect, the fifth wire-bonding portion is preferably located at a position in the fourth direction from the sixth wire-bonding portion, and the eighth wire-bonding portion is preferably located at a position in the second direction from the seventh wire-bonding portion. According to this structure, an interval between the fifth wire-bonding portion and the sixth wire-bonding portion and an interval between the eighth wire-bonding portion and the seventh wire-bonding portion can be secured, and hence the wire-bonding portions of the lead terminals can be inhibited from contact with each other.

In the aforementioned semiconductor laser apparatus according to the first aspect, the fifth wire-bonding portion is preferably located at a position in the fourth direction from the first wire-bonding portion, and the eighth wire-bonding portion is preferably located at a position in the second direction from the third wire-bonding portion. According to this structure, the first wire connecting the first wire-bonding portion and the fifth wire-bonding portion with each other can be arranged without running across above the base, and the third wire connecting the third wire-bonding portion and the eighth wire-bonding portion with each other can be arranged without running across above the base.

In the aforementioned semiconductor laser apparatus according to the first aspect, the sixth wire-bonding portion is preferably located at a position in the fourth direction from the second wire-bonding portion, and the seventh wire-bonding portion is preferably located at a position in the second direction from the fourth wire-bonding portion. According to this structure, the sixth wire-bonding portion can be separated from the second wire-bonding portion along the second (fourth) direction with an interval, and the seventh wire-bonding portion can be separated from the fourth wire-bonding portion along the second (fourth) direction with an interval. Thus, the first and second wires can be inhibited from approaching to each other while the third and fourth wires can be inhibited from approaching to each other.

In the aforementioned structure further comprising the base portion, the fifth lead terminal preferably further has heat radiation portions extending outward from the base portion. According to this structure, heat generated from the first, second and third semiconductor laser devices can be efficiently radiated through the base and the heat radiation portions.

In this case, the heat radiation portions are preferably seamlessly connected to sides of the mounting portions in the second direction and the fourth direction. According to this structure, heat generated from the semiconductor laser devices can be easily radiated through a pair of the heat radiation portions connected to the both sides of the mounting portion in the second direction and the fourth direction.

In the aforementioned semiconductor laser apparatus according to the first aspect, each of the first semiconductor laser device, the second semiconductor laser device and the third semiconductor laser device preferably has an active layer on a side bonded onto the upper surface of the base. According to this structure, the semiconductor laser devices are mounted on the base in a junction-down system, and hence heat can be efficiently radiated from the semiconductor laser devices toward the base. Consequently, temperature characteristics and reliability of the semiconductor laser devices can be improved.

In the aforementioned semiconductor laser apparatus according to the first aspect, the one electrode of the second semiconductor laser device is preferably connected to the fourth electrode. According to this structure, the second semiconductor laser device arranged between the first semiconductor laser device and the third semiconductor laser device can be easily wire-connected with an external terminal through the fourth wire-bonding portion (fourth electrode) not arranged on an optical path to the photodetector on a rear side. The fourth wire-bonding portion of the fourth electrode is located behind the third wire-bonding portion (third electrode), and hence the second semiconductor laser device and the external terminal can be connected with each other through a shorter wire.

In the aforementioned semiconductor laser apparatus according to the first aspect, the photodetector is preferably embedded in the base, and a photosensitive surface of the photodetector is preferably arranged on the upper surface of the base. According to this structure, the intensity of the laser beams from the semiconductor laser devices can be easily detected.

In the aforementioned structure in which the photodetector is embedded in the base, the semiconductor laser apparatus preferably further comprises an insulating film surrounding the photodetector on the upper surface of the base, wherein the second electrode crosses the insulating film and the photosensitive surface. According to this structure, the second electrode connected to the photosensitive surface of the photodetector can be easily extracted outside the photodetector without contact with an electrical connection portion other than the photodetector.

A semiconductor laser apparatus according to a second aspect of the present invention comprises a base having a first electrode with a first wire-bonding portion, a second electrode with a second wire-bonding portion, a third electrode with a third wire-bonding portion and a fourth electrode with a fourth wire-bonding portion arranged on an upper surface of the base, a first semiconductor laser device, a second semiconductor laser device, a third semiconductor laser device and a photodetector arranged on the upper surface, and a first lead terminal, a second lead terminal, a third lead terminal, a fourth lead terminal and a fifth lead terminal, wherein the first semiconductor laser device, the second semiconductor laser device and the third semiconductor laser device emit respective laser beams in a first direction, the first lead terminal, the second lead terminal, the fifth lead terminal, the third lead terminal and the fourth lead terminal extend in the first direction and are arranged in this order along a second direction orthogonal to the first direction, a first end of the fifth lead terminal in the first direction has a mounting portion for mounting the base, a third direction is opposite to the first direction, a fourth direction is opposite to the second direction, the first lead terminal, the second lead terminal, the third lead terminal and the fourth lead terminal are arranged at positions in the third direction from the mounting portion, a second end of the first lead terminal in the first direction has a fifth wire-bonding portion, a fourth end of the second lead terminal in the first direction has a sixth wire-bonding portion, a fifth end of the third lead terminal in the first direction has a seventh wire-bonding portion, a third end of the fourth lead terminal in the first direction has an eighth wire-bonding portion, one electrode of the first semiconductor laser device and a top surface of the photodetector are connected to the first electrode and the second electrode, respectively, one electrode of the second semiconductor laser device is connected to one electrode of the third electrode or the fourth electrode, one electrode of the third semiconductor laser device is connected to the other electrode of the third electrode or the fourth electrode, another electrode of the first semiconductor laser device, another electrode of the second semiconductor laser device, another electrode of the third semiconductor laser device and a lower surface of the photodetector are connected to the fifth lead terminal, the first wire-bonding portion is arranged at a position in the fourth direction from the first semiconductor laser device and in the first direction from the photodetector, the second wire-bonding portion is arranged on the photodetector in the fourth direction and in the third direction from the first wire-bonding portion or at a position outside the photodetector in the fourth direction and in the third direction from the first wire-bonding portion, the third wire-bonding portion is arranged at a position in the second direction from the third semiconductor laser device and in the first direction from the photodetector, the fourth wire-bonding portion is arranged at a position in the second direction from the photodetector and in the third direction from the third wire-bonding portion, the first wire-bonding portion is connected with the fifth wire-bonding portion through a first wire, the second wire-bonding portion is connected with the sixth wire-bonding portion through a second wire, the third wire-bonding portion is connected with the eighth wire-bonding portion through a third wire, and the fourth wire-bonding portion is connected with the seventh wire-bonding portion through a fourth wire.

In the semiconductor laser apparatus according to the second aspect of the present invention, the first wire-bonding portion is arranged at a position in the fourth direction opposite to the second direction from the first semiconductor laser device and in the first direction from the photodetector, the second wire-bonding portion is arranged on the photodetector in the fourth direction and in the third direction from the first wire-bonding portion or at a position outside the photodetector in the fourth direction and in the third direction from the first wire-bonding portion, the third wire-bonding portion is arranged at a position in the second direction from the third semiconductor laser device and in the first direction from the photodetector, the fourth wire-bonding portion is arranged at a position in the second direction from the photodetector and in the third direction from the third wire-bonding portion, the first wire-bonding portion is connected with the fifth wire-bonding portion through a first wire, the second wire-bonding portion is connected with the sixth wire-bonding portion through a second wire, the third wire-bonding portion is connected with the eighth wire-bonding portion through a third wire, and the fourth wire-bonding portion is connected with the seventh wire-bonding portion through a fourth wire. Thus, the wires do not block emitted laser beams for monitoring between the semiconductor laser devices and the photodetector. Thus, the photodetector can accurately detect intensity of laser beams from the semiconductor laser devices.

An optical apparatus according to a third aspect of the present invention comprises a semiconductor laser apparatus including a base having a first electrode with a first wire-bonding portion, a second electrode with a second wire-bonding portion, a third electrode with a third wire-bonding portion and a fourth electrode with a fourth wire-bonding portion arranged on an upper surface of the base, a first semiconductor laser device, a second semiconductor laser device, a third semiconductor laser device and a photodetector arranged on the upper surface, and a first lead terminal, a second lead terminal, a third lead terminal, a fourth lead terminal and a fifth lead terminal, and an optical system controlling a beam emitted from the semiconductor laser apparatus, wherein the first semiconductor laser device, the second semiconductor laser device and the third semiconductor laser device emit respective laser beams in a first direction, the first lead terminal, the second lead terminal, the fifth lead terminal, the third lead terminal and the fourth lead terminal extend in the first direction and are arranged in this order along a second direction orthogonal to the first direction, a first end of the fifth lead terminal in the first direction has a mounting portion for mounting the base, a third direction is opposite to the first direction, a fourth direction is opposite to the second direction, the first lead terminal, the second lead terminal, the third lead terminal and the fourth lead terminal are arranged at positions in the third direction from the mounting portion, a second end of the first lead terminal in the first direction has a fifth wire-bonding portion, a fourth end of the second lead terminal in the first direction has a sixth wire-bonding portion, a fifth end of the third lead terminal in the first direction has a seventh wire-bonding portion, a third end of the fourth lead terminal in the first direction has an eighth wire-bonding portion, one electrode of the first semiconductor laser device and a top surface of the photodetector are connected to the first electrode and the second electrode, respectively, one electrode of the second semiconductor laser device is connected to one electrode of the third electrode or the fourth electrode, one electrode of the third semiconductor laser device is connected to the other electrode of the third electrode or the fourth electrode, another electrode of the first semiconductor laser device, another electrode of the second semiconductor laser device, another electrode of the third semiconductor laser device and a lower surface of the photodetector are connected to the fifth lead terminal, the first wire-bonding portion is arranged at a position in the fourth direction from the first semiconductor laser device and in the first direction from the photodetector, the second wire-bonding portion is arranged at a position in the fourth direction from the first semiconductor laser device and in the third direction from the first wire-bonding portion, the third wire-bonding portion is arranged at a position in the second direction from the third semiconductor laser device and in the first direction from the photodetector, the fourth wire-bonding portion is arranged at a position in the second direction from the third semiconductor laser device and in the third direction from the third wire-bonding portion, the first wire-bonding portion is connected with the fifth wire-bonding portion through a first wire, the second wire-bonding portion is connected with the sixth wire-bonding portion through a second wire, the third wire-bonding portion is connected with the eighth wire-bonding portion through a third wire, and the fourth wire-bonding portion is connected with the seventh wire-bonding portion through a fourth wire.

In the optical apparatus according to the third aspect of the present invention, the first wire-bonding portion is arranged at the position in the fourth direction opposite to the second direction from the first semiconductor laser device and in the first direction from the photodetector, the second wire-bonding portion is arranged at the position in the fourth direction from the first semiconductor laser device and in the third direction from the first wire-bonding portion, the third wire-bonding portion is arranged at the position in the second direction from the third semiconductor laser device and in the first direction from the photodetector, the fourth wire-bonding portion is arranged at the position in the second direction from the third semiconductor laser device and in the third direction from the third wire-bonding portion, the first wire-bonding portion is connected with the fifth wire-bonding portion through the first wire, the second wire-bonding portion is connected with the sixth wire-bonding portion through the second wire, the third wire-bonding portion is connected with the eighth wire-bonding portion through the third wire, and the fourth wire-bonding portion is connected with the seventh wire-bonding portion through the fourth wire. Thus, the wires do not block emitted laser beams for monitoring between the semiconductor laser devices and the photodetector. Thus, the photodetector can accurately detect intensity of laser beams from the semiconductor laser devices. Consequently, the reliable optical pickup capable of stably operating the semiconductor laser apparatus can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
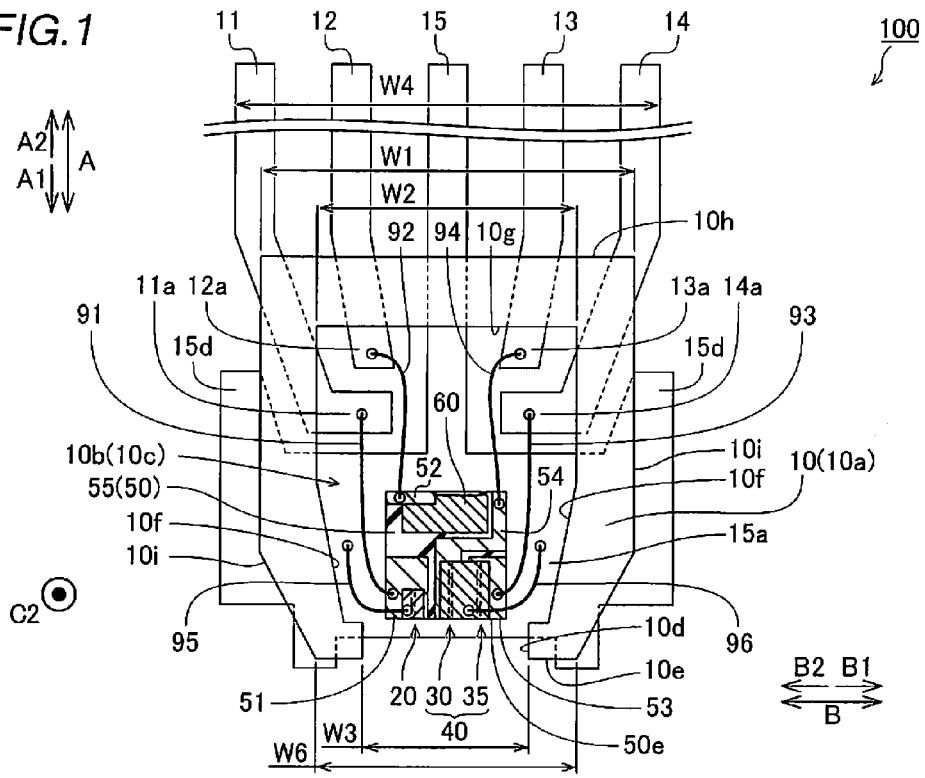
FIG. 1 is a top plan view showing a structure of a semiconductor laser apparatus according to a first embodiment of the present invention.

Embodiments of the present invention are hereinafter described with reference to the drawings.

First Embodiment

A structure of a three-wavelength semiconductor laser apparatus 100 according to a first embodiment of the present invention is now described with reference to FIGS. 1 to 3. The three-wavelength semiconductor laser apparatus 100 is an example of the "semiconductor laser apparatus" in the present invention.

A base portion 10 is made of a resin-molded insulator. The base portion 10 has a thickness of about 1.9 mm (in a direction C2). The base portion 10 has a width W6 in a width direction (in directions B1 and B2) at a front surface 10e on a front side (A1 side), which is an emitting side and a width W1 (W1>W6) on a rear side (A2 side). The base portion 10 has a recess portion 10b in an upper surface 10a, as shown in FIG. 1. A bottom surface of the recess portion 10b is arranged at a depth about half the thickness of the base portion 10. The recess portion 10b has an opening 10c with a width W2, which opens in the upper surface 10a (on a C2 side), and an opening 10d with a width W3 (W3<W2), which opens in the front surface 10e (on the A1 side). The openings 10c and 10d connect to each other from the upper surface 10a to the front surface 10e. The recess portion 10b is constituted a pair of side walls 10f extending in an anteroposterior direction, which is a direction A, from both ends of the opening 10d in a direction B, a back wall 10g connecting back ends of the side walls 10f in the direction B and a bottom surface connecting the side walls 10f and the back wall 10g on the lower portion (on the rear side of the plane of the figure). The base portion 10 has a tapered outer shape in which an A1-side width of an outer surface 10i is decreased toward the front surface 10e from a back surface 10h as viewed from a side of the upper surface 10a. The front side and the rear side of the base portion 10 are examples of the "first direction" and the "third direction" in the present invention, respectively. The direction B1 and the direction B2 of the base portion 10 are examples of the "second direction" and the "fourth direction" in the present invention, respectively.

The base portion 10 is provided with lead terminals 11, 12, 13, 14 and 15 each having a thickness of about 0.4 mm and made of a metal lead frame. The lead terminals 11, 12, 13, 14 and 15 are examples of the "first lead terminal", the "second lead terminal", the "third lead terminal", the "fourth lead terminal" and the "fifth lead terminal" in the present invention, respectively. The lead terminal 15 is arranged at a substantially central portion of the base portion 10 in the direction B. The lead terminals 11, 12, 15, 13 and 14 are arranged in this order from the B2 side to the B1 side.

The lead terminals 11 to 15 are insulated from each other. Front ends of the lead terminals 11 to 15, which are ends on the A1 side, are arranged in the recess portion 10b. The lead terminals 12, 13 and 15 pass through the base portion 10 from the back wall 10g to the back surface 10h and extend backward. The lead terminals 11 and 14 pass through the base portion 10 from the side wall 10f to the back surface 10h and the outer surface 10i and extend backward. Wire-bonding portions 11a to 14a are arranged on the front ends of the lead terminals 11 to 14. The lead terminal 15 linearly extends along the direction A. The lead terminal 15 has a mounting portion 15a connected to the A1-side end of the lead terminal 15. The mounting portion 15a widens in the direction B on the bottom surface of the recess portion 10b on a front side (A1 side) of the wire-bonding portions 11a to 14a. The wire-bonding portions 11a, 12a, 13a and 14a are examples of the "fifth wire-bonding portion", the "sixth wire-bonding portion", the "seventh wire-bonding portion" and the "eighth wire-bonding portion" in the present invention, respectively. The A1-side ends of the lead terminals 11 to 15 are examples of the "second end", the "fourth end", the "fifth end", the "third end" and the "first end" in the present invention, respectively.

The width W1 is smaller than a maximum width W4 from the lead terminal 11 to the lead terminal 14 (W1<W4). On the bottom surface of the recess portion 10b, the front ends of the lead terminals 12 and 13 on the A1 side are bent to a side of the lead terminal 15. Thus, the wire-bonding portions 12a and 13a are closer to the lead terminal 15 in the recess portion 10b than back ends of the respective lead terminals on the A2 side. On the bottom surface of the recess portion 10b, the lead terminal 11 is bent to the side of the lead terminal 15 (B1 side) from the outside (B2 side) of the lead terminal 12, and the wire-bonding portion 11a is closer to the lead terminal 15 than the back end of the lead terminal 11. Similarly, on the bottom surface of the recess portion 10b, the lead terminal 14 is bent to the side of the lead terminal 15 (B2 side) from the outside (B1 side) of the lead terminal 13, and the wire-bonding portion 14a is closer to the lead terminal 15 than the back end of the lead terminal 14.

As shown in FIG. 1, the wire-bonding portions 11a and 14a are located in the front of the wire-bonding portions 12a and 13a, respectively. The wire-bonding portion 11a is arranged at a position deviating to the lead terminal 11 outside (on the B2 side of) the wire-bonding portion 12a, and the wire-bonding portion 14a is arranged at a position deviating to the lead terminal 14 outside (on the B1 side of) the wire-bonding portion 13a.

A pair of heat radiation portions 15d are arranged substantially symmetrically on both sides of the mounting portion 15a in the direction B. The heat radiation portions 15d pass through the base portion 10 from the side walls 10f to the outer surface 10i in the directions B1 and B2 to be exposed. The lead terminal 15, the mounting portion 15a and the heat radiation portions 15d are seamlessly formed with a thickness of about 0.4 mm.

A lower surface of a submount 50 is bonded through a conductive adhesive layer (not shown) in a substantially central portion of an upper surface of the mounting portion 15a. The submount 50 is arranged such that a front surface 50e having a width W5 (in the direction B) of about 1.5 mm faces the A1 side of the mounting portion 15a and the front surface 50e is substantially parallel to the front surface 10e. The submount 50 has a substantially rectangular shape in plan view. The submount 50 is an example of the "base" in the present invention.

A blue-violet semiconductor laser device 20 with a lasing wavelength of about 405 nm and a two-wavelength semiconductor laser device 40 having a red semiconductor laser device 30 with a lasing wavelength of about 650 nm and an infrared semiconductor laser device 35 with a lasing wavelength of about 780 nm monolithically formed are fixed on the submount 50 made of n-type Si. The blue-violet semiconductor laser device 20, the red semiconductor laser device 30 and the infrared semiconductor laser device 35 are examples of the "first semiconductor laser device", the "second semiconductor laser device" and the "third semiconductor laser device" in the present invention, respectively.

In a pair of cavity facets formed on each of the blue-violet semiconductor laser device 20 and the two-wavelength semiconductor laser device 40, that emitting a laser beam having relatively large light intensity serves as a light-emitting surface and that having relatively small light intensity serves as a light-reflecting surface. Therefore, the laser beam is emitted in a direction A1. The light-emitting surface of each semiconductor laser device is aligned on the same plane as the front surface 50e. A dielectric multilayer film (not shown) made of an AlN film, an $Al_2O_3$ film or the like is formed on the light-emitting surface and the light-reflecting surface of each semiconductor laser device by facet coating treatment in a manufacturing process.

Figure 3:
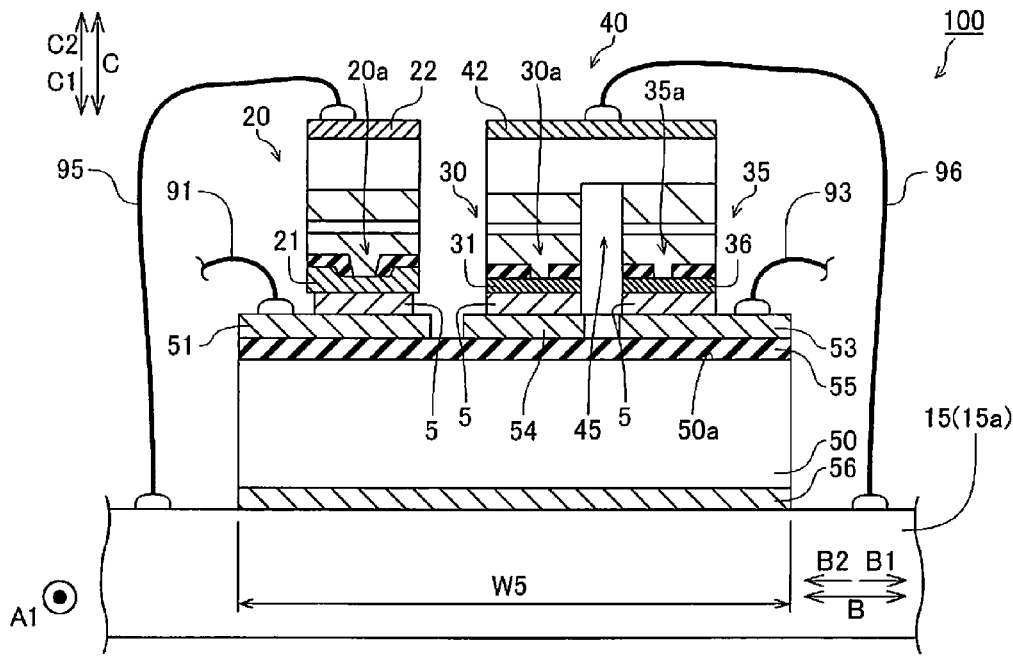
FIG. 3 is a front elevational view of the semiconductor laser apparatus according to the first embodiment of the present invention, as viewed from a laser beam emitting direction.

As shown in FIG. 3, the blue-violet semiconductor laser device 20 and the two-wavelength semiconductor laser device 40 are adjacent to each other at a prescribed interval in the width direction. In the blue-violet semiconductor laser device 20, a semiconductor device layer made of a nitride-based semiconductor including an active layer is formed on a surface (lower surface) of an n-type GaN substrate. The two-wavelength semiconductor laser device 40 has a structure in which the red semiconductor laser device 30 and the infrared semiconductor laser device 35 are formed on the B2 side and the B1 side, respectively, through a recess portion 45 (groove portion), a bottom surface of which reaches an n-type GaAs substrate, on a surface (lower surface) of the common n-type GaAs substrate. The red semiconductor laser device 30 is made of a GaAs-based semiconductor material, and the infrared semiconductor laser device 35 is made of a GaInP-based semiconductor material.

A ridge 20a (projecting portion) extending in the direction A in which a cavity extends is formed on a side (C1 side) of a lower surface of the semiconductor device layer of the blue-violet semiconductor laser device 20. Thus, a light-emitting point (waveguide) of the blue-violet semiconductor laser device 20 is formed on the active layer above (on the C2 side of) the ridge 20a. Ridges 30a and 35a are formed on sides of lower surfaces of respective semiconductor device layers of the red semiconductor laser device 30 and the infrared semiconductor laser device 35. Thus, light-emitting points of the red semiconductor laser device 30 and the infrared semiconductor laser device 35 are formed on active layers above the ridges 30a and 35a. As shown in FIG. 2, a cavity length (in the direction A) of the blue-violet semiconductor laser device 20 is about half a cavity length of the two-wavelength semiconductor laser device 40. The blue-violet semiconductor laser device 20 and the two-wavelength semiconductor laser device 40 are mounted on the submount 50 in a junction-down system such that the light-emitting surfaces face the opening 10d. In other words, each semiconductor laser device is fixed such that a side of each semiconductor laser device formed with the semiconductor device layer is opposed to an upper surface 50a, as shown in FIG. 3.

A photodiode (PD) 60 employed to monitor intensity of laser beams is arranged on a side of the light-reflecting surfaces of the blue-violet semiconductor laser device 20 and the two-wavelength semiconductor laser device 40 in a back portion of the submount 50. The PD 60 is formed in a state embedded in a surface of the submount 50, and a photosensitive surface 60a, which is a p-type region of the PD 60, is exposed on a part of the upper surface 50a. The PD 60 is an example of the "photodetector" in the present invention, and the photosensitive surface 60a is an example of the "top surface of the photodetector" in the present invention.

Pad electrodes 51, 53 and 54 are provided in a state isolated from each other on positions of the upper surface 50a of the submount 50 onto which the blue-violet semiconductor laser device 20 and the two-wavelength semiconductor laser device 40 are bonded. Specifically, the pad electrode 51 having a substantially rectangular shape and protruding sideward (to the B2 side) from the blue-violet semiconductor laser device 20 is provided on a front corner of the upper surface 50a on one side (B2 side) in the width direction, as shown in FIG. 2. The pad electrode 53 having a substantially rectangular shape and protruding sideward (to the B1 side) from the infrared semiconductor laser device 35 is provided on a front corner of the upper surface 50a on the other side (B1 side) in the width direction. The pad electrodes 51 and 53 are provided substantially parallel to each other at a prescribed interval in the width direction, and the pad electrode 54 is arranged between the pad electrodes 51 and 53. On a substantially central portion of the submount 50 in the width direction, the pad electrode 54 extends backward from the vicinity of the front surface 50e to the vicinity of a front end of the PD 60, and thereafter extends to a rear side of the pad electrode 53 and reaches the vicinity of one side (B1 side) of the submount 50. Then, the pad electrode 54 extends backward again from the vicinity of one side of the submount 50 to a back corner of the submount 50. Thus, the pad electrode 54 is extracted avoiding the PD 60 in the back portion of the submount 50. The pad electrodes 51, 53 and 54 are examples of the "first electrode", the "third electrode" and the "fourth electrode" in the present invention, respectively. The pad electrodes 51, 53 and 54 are formed on an insulating film 55 made of $SiO_2$ formed on the upper surface 50a, and insulated from the submount 50.

In this state, in the blue-violet semiconductor laser device 20, a p-side electrode 21 formed on a lower surface thereof is bonded to the pad electrode 51 through a conductive adhesive layer 5, as shown in FIG. 3. In the red semiconductor laser device 30 and the infrared semiconductor laser device 35 of the two-wavelength semiconductor laser device 40, p-side electrodes 31 and 36 formed on lower surfaces thereof are bonded to the pad electrodes 54 and 53 through conductive adhesive layers 5, respectively. The p-side electrodes 21, 31 and 36 are examples of the "one electrode" in the present invention.

Figure 2:
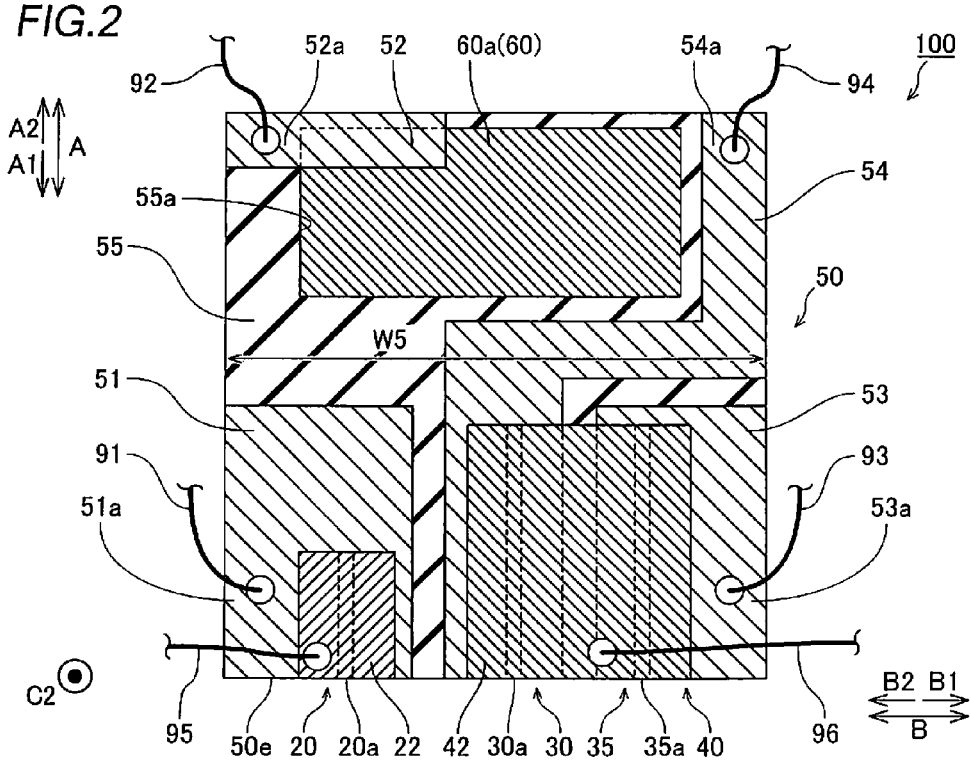
FIG. 2 is a top plan view showing a detailed structure of the semiconductor laser apparatus according to the first embodiment of the present invention.

As shown in FIG. 2, a pad electrode 52 conducting to the p-type region of the PD 60 is provided on one corner (on the B2 side) of the PD 60. A top surface (photosensitive surface 60a) of the PD 60 is exposed from an opening 55a provided in the insulating film 55 surrounding the periphery, and the PD 60 and the pad electrode 52 are connected with each other in a part of this opening 55a. The pad electrode 52 extends in the direction B2 from a rear edge of the PD 60 to the upper surface 50a of the submount 50 outside the PD 60. In other words, the pad electrode 52 crosses the photosensitive surface 60a of the rear side of PD 60 and an upper surface of the insulating film 55. The pad electrode 52 outside the PD 60 is formed on the insulating film 55, whereby the pad electrode 52 and the submount 50 are insulated from each other. The pad electrode 52 is an example of the "second electrode" in the present invention.

At this time, a wire-bonding portion 51a is located at a part of the pad electrode 51 outside on the opposite side of the blue-violet semiconductor laser device 20 to the red semiconductor laser device 30 (on the B2 side) and in the front of the PD 60, as shown in FIG. 2. A wire-bonding portion 52a is located at a part of the pad electrode 52 on a side (B2 side) closer to the lead terminal 11 and at the back of the wire-bonding portion 51a. The wire-bonding portion 52a is arranged at a region in the direction B2 from the blue-violet semiconductor laser device 20 and outside the PD 60 (photosensitive surface 60a).

A wire-bonding portion 53a is located at a part of the pad electrode 53 outside on the opposite side of the infrared semiconductor laser device 35 to the red semiconductor laser device 30 (on the B1 side) and in the front of the PD 60. A wire-bonding portion 54a is located at a part of the pad electrode 54 in the direction B1 from the infrared semiconductor laser device 35 (on a side closer to the lead terminal 14) and at the back of the wire-bonding portion 53a. In other words, the wire-bonding portions 51a to 54a are arranged on regions near four corners of the submount 50. The wire-bonding portions 51a, 52a, 53a and 54a are examples of the "first wire-bonding portion", the "second wire-bonding portion", the "third wire-bonding portion" and the "fourth wire-bonding portion" in the present invention, respectively.

As to the positional relation between the wire-bonding portions 51a, 52a, 53a and 54a (see FIG. 2) and the lead terminals 11 to 14, the wire-bonding portion 11a of the lead terminal 11 is located at a position in the direction B2 from the wire-bonding portion 51a, and the wire-bonding portion 14a of the lead terminal 14 is located at a position in the direction B1 from the wire-bonding portion 53a, as shown in FIG. 1. The wire-bonding portion 12a of the lead terminal 12 is located at a position in the direction B2 from the wire-bonding portion 52a, and the wire-bonding portion 13a of the lead terminal 13 is located in the direction B1 from the wire-bonding portion 54a.

A first end of a metal wire 91 made of Au or the like is connected to the wire-bonding portion 51a, and a second end thereof is connected to the wire-bonding portion 11a. A first end of a metal wire 95 is connected to an n-side electrode 22 formed on an upper surface of the substrate of the blue-violet semiconductor laser device 20, and a second end thereof is connected to the mounting portion 15a on a side (B2 side) of the submount 50. A first end of a metal wire 92 is connected to the wire-bonding portion 52a, and a second end thereof is connected to the wire-bonding portion 12a. A first end of a metal wire 93 is connected to the wire-bonding portion 53a, and a second end thereof is connected to the wire-bonding portion 14a. A first end of a metal wire 94 is connected to the wire-bonding portion 54a, and a second end thereof is connected to the wire-bonding portion 13a. The metal wires 91, 92, 93 and 94 are examples of the "first wire", the "second wire", the "third wire" and the "fourth wire" in the present invention, respectively. The n-side electrode 22 is an example of the "other electrode" in the present invention.

A first end of a metal wire 96 is connected to an n-side electrode 42 (common electrode) formed on an upper surface of the substrate of the two-wavelength semiconductor laser device 40, and a second end thereof is connected to the mounting portion 15a on a side (B1 side) of the submount 50. The lower surface of the submount 50 is electrically connected to the mounting portion 15a through a lower electrode 56 made of A1 or the like. Thus, current can be individually supplied from anode lead terminals to the semiconductor laser devices, and n-side electrodes of the semiconductor laser devices and the PD 60 are connected to a common terminal (lead terminal 15). The n-side electrode 42 is an example of the "other electrode" in the present invention.

According to the first embodiment, as hereinabove described, the wire-bonding portions 51a, 52a, 53a and 54a have a positional relation on the upper surface 50a described above, and in this state, the wire-bonding portions 51a to 54a are connected with the lead terminals 11 to 14 through the metal wires 91 to 94, respectively. Thus, all the wire-bonding portions 51a, 52a, 53a and 54a can be arranged on the upper surface 50a other than a region between the blue-violet and two-wavelength semiconductor laser devices 20 and 40 and the PD 60. Thus, the metal wires 91 to 94 do not lie between each semiconductor laser device and the PD 60, thereby not blocking emitted laser beams for monitoring. Thus, the PD 60 can accurately detect intensity of the laser beams from the blue-violet semiconductor laser device 20 and the two-wavelength semiconductor laser device 40.

The wire-bonding portions 51a, 52a, 53a and 54a are arranged on the regions near the four corners of the submount 50. Thus, the wire-bonding portions 51a, 52a, 53a and 54a are separated from each other with respective intervals, and hence the metal wires 91 to 94 can be easily bonded and inhibited from contact with each other.

The wire-bonding portions 11a and 14a are arranged in the front of the wire-bonding portions 12a and 13a, respectively. Thus, the wire-bonding portion 11a and the wire-bonding portion 51a are rendered closer to each other in the anteroposterior direction, and hence a length of the metal wire 91 can be rendered shorter, dissimilarly to a case where the wire-bonding portion 11a and the wire-bonding portion 12a are provided at the same position in the anteroposterior direction. Similarly, the wire-bonding portion 14a and the wire-bonding portion 53a are rendered closer to each other in the anteroposterior direction, and hence a length of the metal wire 93 can be rendered shorter. Further, the lengths of the metal wires are short, and hence the metal wires can be easily bonded.

On the bottom surface of the recess portion 10b, the front end of the lead terminal 11 is bent toward the lead terminal 12. On the bottom surface of the recess portion 10b, the front end of the lead terminal 14 is bent toward the lead terminal 13. Thus, the front end of the lead terminal 11 and the front end of the lead terminal 14 are bent in the recess portion 10b, and hence larger areas of the wire-bonding portions 11a and 14a can be secured. Thus, a bonding position of the metal wire 91 on the wire-bonding portion 11a can be easily deviated to the B2 side from a bonding position of the metal wire 92 on the wire-bonding portion 12a. Further, a bonding position of the metal wire 93 on the wire-bonding portion 14a can be easily deviated to the B1 side from a bonding position of the metal wire 94 on the wire-bonding portion 13a.

The front ends of the lead terminals 12 and 13 are bent toward the lead terminal 15. Thus, the front ends of the lead terminals 12 and 13 can approach the lead terminal 15 (the central portion in the direction B), and hence the bonding position of the metal wire 92 on the wire-bonding portion 12a can be easily deviated to the B1 side from the bonding position of the metal wire 91 on the wire-bonding portion 11a. Further, the bonding position of the metal wire 94 on the wire-bonding portion 13a can be easily deviated to the B2 side from the bonding position of the metal wire 93 on the wire-bonding portion 14a. Thus, contact between the metal wires 91 and 92 can be easily inhibited, and contact between the metal wires 93 and 94 can be easily inhibited.

The metal wire 92 connects the wire-bonding portions 12a and 52a, and the metal wire 94 connects the wire-bonding portions 13a and 54a. Thus, the wire-bonding portions 52a and 54a located on the rear side among the wire-bonding portions on the submount 50 are connected with the wire-bonding portions 12a and 13a located on the rear side among the wire-bonding portions on the lead terminals, respectively, and hence lengths of the metal wires 92 and 94 can be rendered shorter. Further, the lengths of the metal wires are short, and hence the metal wires can be easily bonded.

The width W1 is smaller than the width W4. Thus, intervals between the lead terminals 11 to 15 (in the direction B) can be increased without increasing a width of the base portion 10, and hence the lead terminals can be easily formed. Further, contact between the lead terminals 11 to 15 in the width direction (direction B) can be inhibited.

The base portion 10 has a tapered outer shape along the direction A1 in which the laser beams are emitted, and hence this semiconductor laser apparatus 100 can be easily built into a housing of an optical pickup or the like through an insertion hole or the like.

The wire-bonding portion 11a is arranged at a position deviating to the lead terminal 11 outside the wire-bonding portion 12a, and the wire-bonding portion 14a is arranged at a position deviating to the lead terminal 14 outside the wire-bonding portion 13a. Thus, the metal wire 91 can be easily inhibited from contact with the metal wire 92, and the metal wire 93 can be easily inhibited from contact with the metal wire 94.

The wire-bonding portion 11a is located at the position in the direction B2 from the wire-bonding portion 51a on the submount 50, and the wire-bonding portion 14a is located at the position in the direction B1 from the wire-bonding portion 53a on the submount 50. Thus, the metal wire 91 connecting the wire-bonding portion 51a and the wire-bonding portion 11a can be arranged without running across above the submount 50, and the metal wire 93 connecting the wire-bonding portion 53a and the wire-bonding portion 14a can be arranged without running across above the submount 50.

The wire-bonding portion 12a is located at the position in the direction B2 from the wire-bonding portion 52a on the submount 50, and the wire-bonding portion 13a is located at the position in the direction B1 from the wire-bonding portion 54a on the submount 50. Thus, the wire-bonding portion 12a can be separated from the wire-bonding portion 52a along the direction B with an interval, and the wire-bonding portion 13a can be separated from the wire-bonding portion 54a along the direction B with an interval. Thus, the metal wires 91 and 92 can be inhibited from approaching to each other while the metal wires 93 and 94 can be inhibited from approaching to each other.

The lead terminal 15 has the heat radiation portions 15d extending outward on the B1 and B2 sides of the base portion 10. Thus, heat generated from the blue-violet semiconductor laser device 20, the red semiconductor laser device 30 and the infrared semiconductor laser device 35 can be efficiently radiated through the submount 50 and the heat radiation portions 15d. Further, the heat radiation portions 15d are seamlessly connected to the both sides of the mounting portion 15a of the lead terminal 15, and hence heat generated from each semiconductor laser device can be easily radiated through the pair of heat radiation portions 15d connected to the both sides of the mounting portion 15a.

The blue-violet semiconductor laser device 20 and the two-wavelength semiconductor laser device 40 each are formed with the semiconductor device layer on a side closer to the submount 50. In other words, each semiconductor laser device is mounted on the submount 50 in a junction-down system, and hence heat can be efficiently radiated from the semiconductor device layer, which is a heat generation source, toward the submount 50. Consequently, temperature characteristics and reliability of the blue-violet semiconductor laser device 20, the red semiconductor laser device 30 and the infrared semiconductor laser device 35 can be improved.

In the three-wavelength semiconductor laser apparatus 100, the lead terminal 15 comprises the heat radiation portions 15d connected to the both sides of the mounting portion 15a, and the heat radiation portions 15d extend outward from the base portion 10. Thus, heat generated from the blue-violet semiconductor laser device 20 and the two-wavelength semiconductor laser device 40 can be efficiently radiated through the submount 50 and the heat radiation portions 15d.

The red semiconductor laser device 30 is connected to the pad electrode 54. Thus, a length of a pattern of the wire (metal wire 94) connected to the central red semiconductor laser device 30 can be rendered shorter by connecting the wire to the wire-bonding portion 54a from a back portion of the red semiconductor laser device 30. Further, the pattern of the wire connected to the central red semiconductor laser device 30 is not formed on a side of the light-emitting surface, whereby positions of the light-emitting surfaces of the three semiconductor laser devices can be easily aligned on the same plane.

The PD 60 is embedded in the submount 50, and the photosensitive surface 60a of the PD 60 is arranged on the upper surface 50a. Thus, a height of the photosensitive surface 60a and respective heights of the light-emitting points of the semiconductor laser devices 20, 30 and 35 can be easily rendered substantially equal to each other. Therefore, intensity of the laser beams from the blue-violet semiconductor laser device 20, the red semiconductor laser device 30 and the infrared semiconductor laser device 35 can be easily detected.

The pad electrode 52 crosses the upper surface of the insulating film 55 and the photosensitive surface 60a of the PD 60. Thus, the pad electrode 52 connected to the photosensitive surface 60a of the PD 60 can be easily extracted outside the PD 60 without unnecessary contact with the pad electrode 54, for example, other than the PD 60.

The pad electrode 52 extends in the direction B on the photosensitive surface 60a along the rear edge (on the A2 side) of the PD 60. Thus, a contact (bonding) area of the pad electrode 52 and the PD 60 can be increased, and hence the pad electrode 52 can be inhibited from being peeled from an upper surface of the submount 50. Further, a bonding position of the metal wire 92 on the wire-bonding portion 52a can be easily adjusted along an extensional direction of the pad electrode 52.

Second Embodiment

Figure 4:
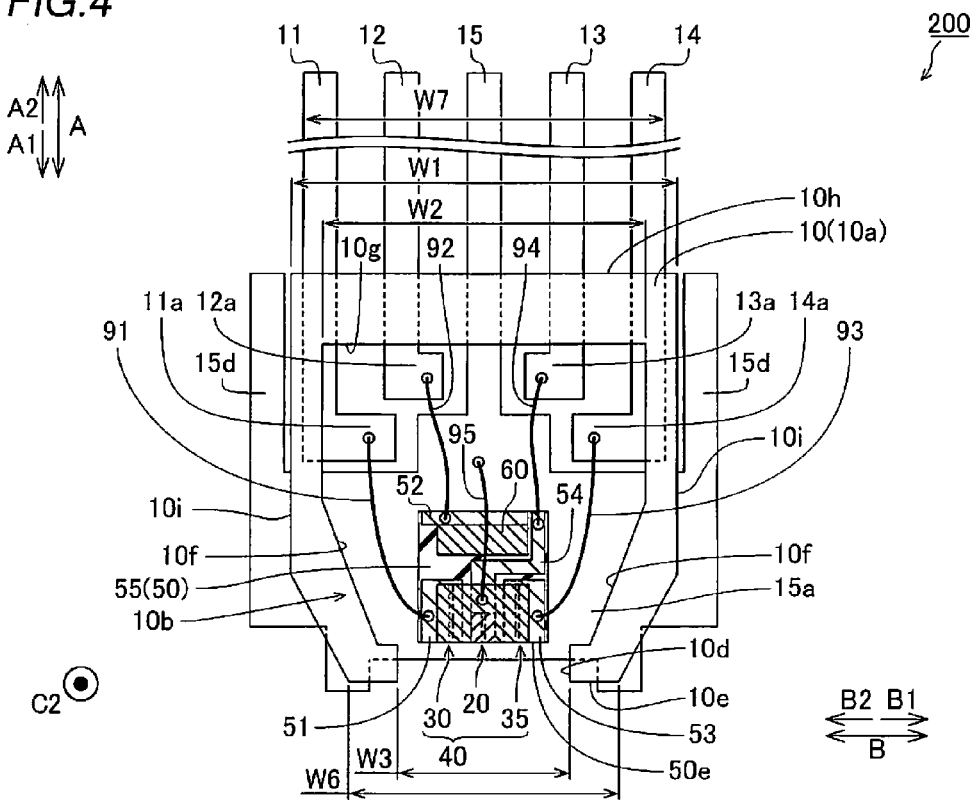
FIG. 4 is a top plan view showing a structure of a semiconductor laser apparatus according to a second embodiment of the present invention.
Figure 5:
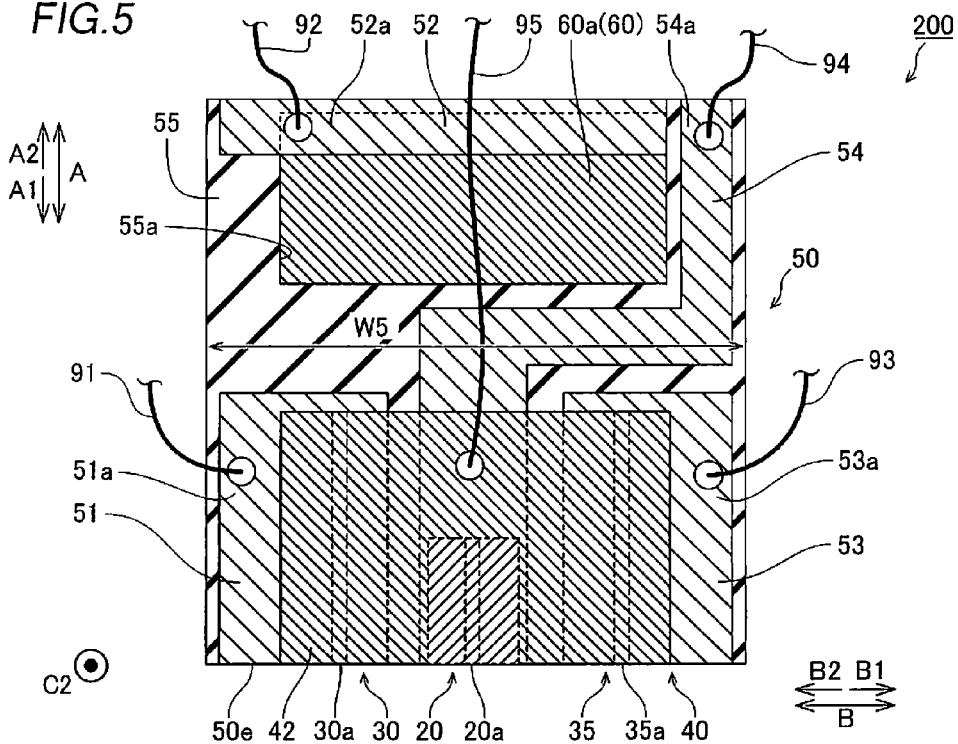
FIG. 5 is a top plan view showing a detailed structure of the semiconductor laser apparatus according to the second embodiment of the present invention.
Figure 6:
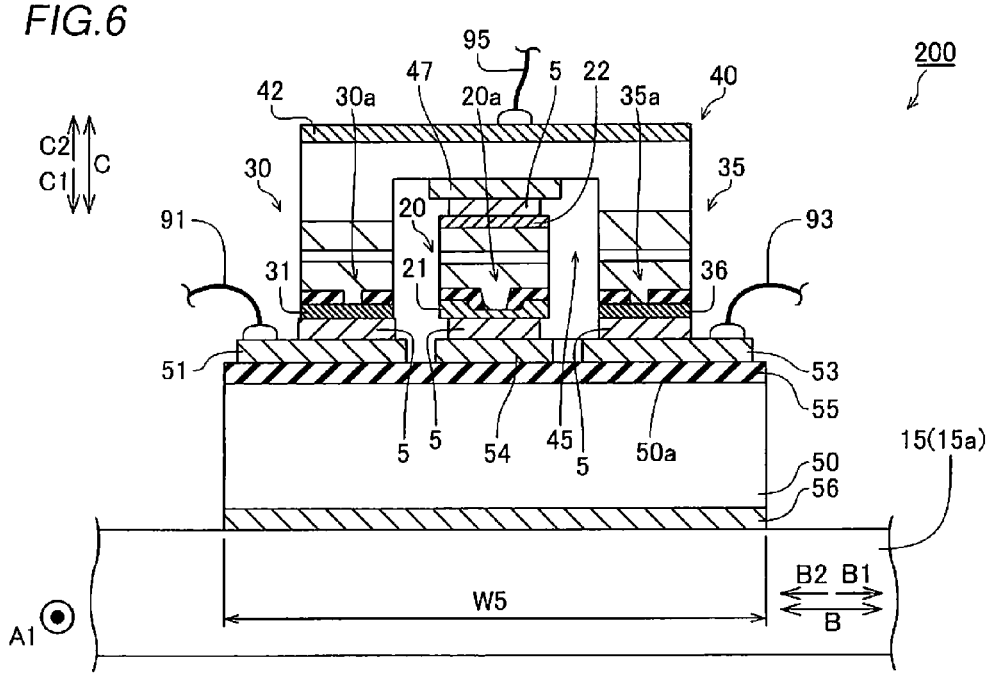
FIG. 6 is a front elevational view of the semiconductor laser apparatus according to the second embodiment of the present invention, as viewed from a laser beam emitting direction.

A three-wavelength semiconductor laser apparatus 200 according to a second embodiment of the present invention is now described. In this three-wavelength semiconductor laser apparatus 200, a blue-violet semiconductor laser device 20 is arranged on a substantially central portion of a submount 50 in a direction B, and a two-wavelength semiconductor laser device 40 is so arranged as to straddle an upside of the blue-violet semiconductor laser device 20 in the direction B, as shown in FIGS. 4 to 6. A red semiconductor laser device 30 and an infrared semiconductor laser device 35 constituting the two-wavelength semiconductor laser device 40 are arranged on B2 and B1 sides of the blue-violet semiconductor laser device 20, respectively. The three-wavelength semiconductor laser apparatus 200 is an example of the "semiconductor laser apparatus" in the present invention. The blue-violet semiconductor laser device 20, the red semiconductor laser device 30 and the infrared semiconductor laser device 35 are examples of the "second semiconductor laser device", the "first semiconductor laser device" and the "third semiconductor laser device" in the present invention.

In other words, the two-wavelength semiconductor laser device 40 has a recess portion 45 between the red semiconductor laser device 30 and the infrared semiconductor laser device 35, as shown in FIG. 6. A pad electrode 47 extending in an anteroposterior direction is formed on a bottom surface of the recess portion 45. An n-side electrode 22 of the blue-violet semiconductor laser device 20 is bonded to the pad electrode 47 through a conductive adhesive layer 5.

Therefore, according to the second embodiment, an n-side electrode 42 formed on an upper surface of the two-wavelength semiconductor laser device 40 and a mounting portion 15a are connected with each other through a metal wire 95, whereby cathode common connection is achieved.

A metal wire 91 electrically connects a p-side electrode 31 of the red semiconductor laser device 30 and a lead terminal 11 through a pad electrode 51, and a metal wire 93 electrically connects a p-side electrode 36 of the infrared semiconductor laser device 35 and a lead terminal 14 through a pad electrode 53. A metal wire 94 connects a p-side electrode 21 of the blue-violet semiconductor laser device 20 and a lead terminal 13 through a pad electrode 54.

As shown in FIG. 5, a pad electrode 52 extends in the direction B along a substantially entire region of a rear edge of a PD 60. A metal wire 92 is connected to a portion of a wire-bonding portion 52a arranged in the PD 60 (photosensitive surface 60a).

Lead terminals 11 to 14 linearly extend while keeping intervals therebetween substantially parallel to a lead terminal 15, and pass through a base portion 10 frontward (in a direction A1). Therefore, a width W1 of the base portion 10 is larger than a maximum width W7 from the lead terminal 11 to the lead terminal 14 (W1>W7). In a recess portion 10b, front end regions of the lead terminals are bent to approach the lead terminal 15. The width W7 is smaller than the width W1, and hence heat radiation portions 15d provided on both sides of the base portion 10 can extend backward (to an A2 side) as compared with the first embodiment.

The wire-bonding portion 52a of the pad electrode 52 is arranged on the photosensitive surface 60a. Thus, the wire-bonding portion 52a to which the metal wire 92 is bonded can be easily arranged by effectively utilizing the portion of the pad electrode 52 extending on the photosensitive surface 60a.

The remaining structure of the three-wavelength semiconductor laser apparatus 200 is substantially similar to that of the three-wavelength semiconductor laser apparatus 100 according to the first embodiment and denoted by the same reference numerals in the figures. The effects of the second embodiment are similar to those of the first embodiment.

Modification of Second Embodiment

A three-wavelength semiconductor laser apparatus 205 according to a modification of the second embodiment is now described. The three-wavelength semiconductor laser apparatus 205 is an example of the "semiconductor laser apparatus" in the present invention.

Figure 7:
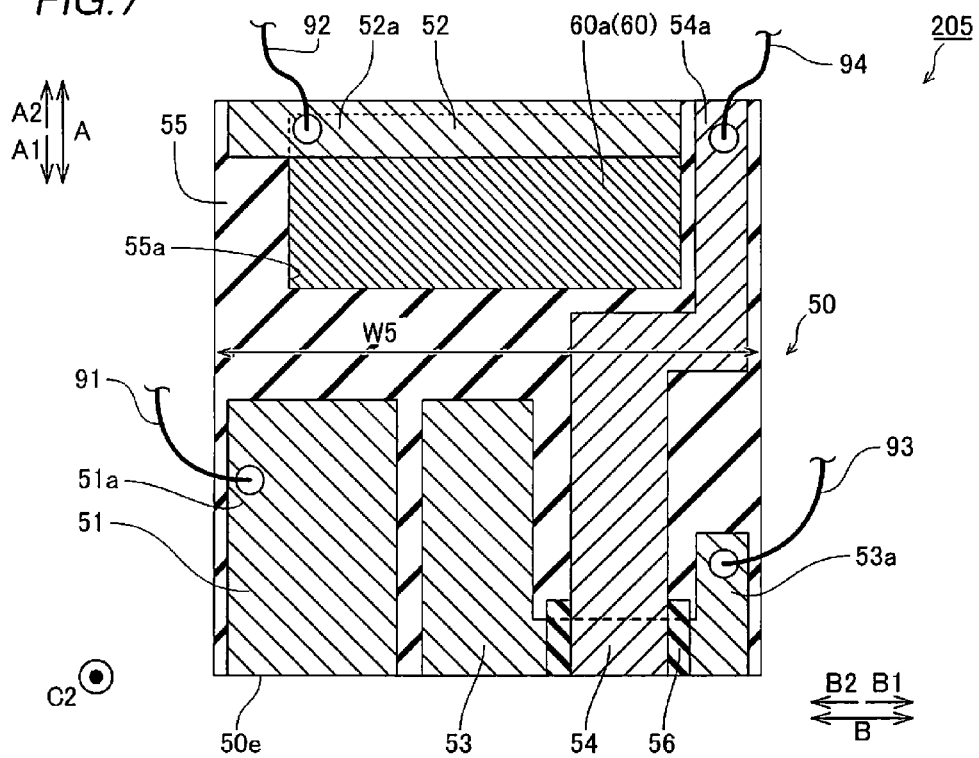
FIG. 7 is a top plan view showing an upper surface of a submount in a state where a semiconductor laser device is removed in a semiconductor laser apparatus according to a modification of the second embodiment of the present invention.

In other words, an A1-side end of a pad electrode 53 traverses in a direction B1 under a pad electrode 54 and extends to a region between the pad electrode 54 and a B1-side end of a submount 50, as shown in FIG. 7. An insulating film 56 is formed between the pad electrode 53 and the pad electrode 54 in a region where the pad electrode 53 traverses under the pad electrode 54. A wire-bonding portion 53a is provided on a region of the pad electrode 53 on the A1 side and the B1 side. An A2-side end of the pad electrode 54 passes between a PD 60 and a B1-side end of the submount 50 avoiding the PD 60 and extends to a back corner of the submount 50. A wire-bonding portion 54a is provided on an A2-side end of the pad electrode 54. Therefore, a blue-violet semiconductor laser device 20 is connected to a lead terminal 14 through a metal wire 93, and an infrared semiconductor laser device 35 is connected to a lead terminal 13 through a metal wire 94.

The remaining structure of the three-wavelength semiconductor laser apparatus 205 according to the modification of the second embodiment is substantially similar to that of the three-wavelength semiconductor laser apparatus 200 according to the second embodiment and denoted by the same reference numerals in the figure. The effects of the modification of the second embodiment are similar to those of the second embodiment.

Third Embodiment

An optical pickup 300 according to a third embodiment of the present invention is now described. The optical pickup 300 is an example of the "optical apparatus" in the present invention.

Figure 8:
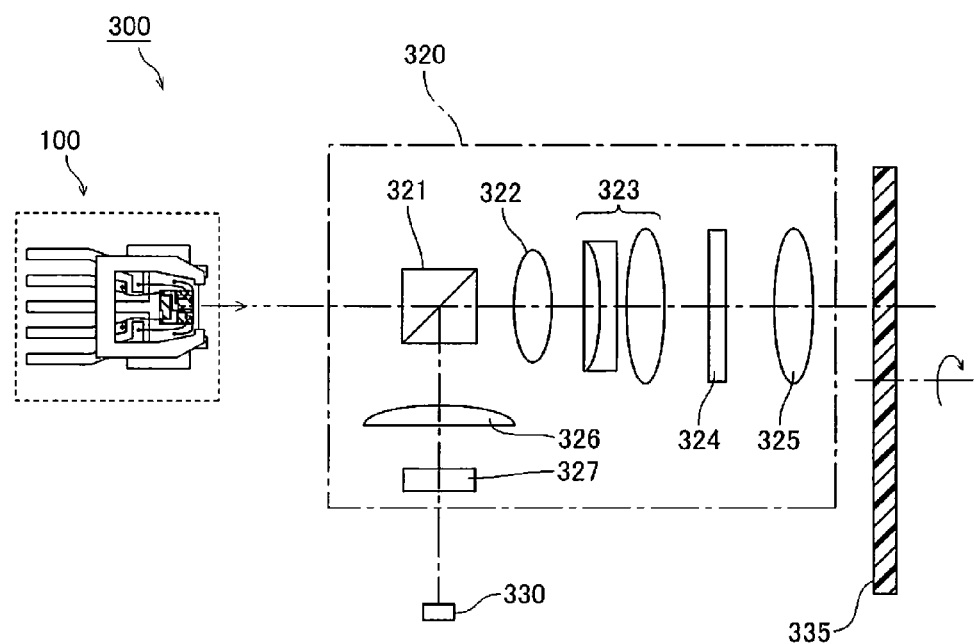
FIG. 8 is a schematic diagram showing a structure of an optical pickup according to a third embodiment of the present invention.

The optical pickup 300 comprises the aforementioned three-wavelength semiconductor laser apparatus 100 according to the first embodiment, an optical system 320 adjusting laser beams emitted from the three-wavelength semiconductor laser apparatus 100 and a light detection portion 330 receiving the laser beams, as shown in FIG. 8.

The optical system 320 has a polarizing beam splitter (PBS) 321, a collimator lens 322, a beam expander 323, a λ/4 plate 324, an objective lens 325, a cylindrical lens 326 and an optical axis correction device 327.

The PBS 321 totally transmits the laser beams emitted from the three-wavelength semiconductor laser apparatus 100, and totally reflects the laser beams fed back from an optical disc 335. The collimator lens 322 converts the laser beams emitted from the three-wavelength semiconductor laser apparatus 100 and transmitted through the PBS 321 to parallel beams. The beam expander 323 is constituted by a concave lens, a convex lens and an actuator (not shown). The actuator has a function of correcting wave surface states of the laser beams emitted from the three-wavelength semiconductor laser apparatus 100 by varying a distance between the concave lens and the convex lens in response to a servo signal from a servo circuit described later.

The λ/4 plate 324 converts the linearly polarized laser beams, substantially converted to the parallel beams by the collimator lens 322, to circularly polarized beams. Further, the λ/4 plate 324 converts the circularly polarized laser beams fed back from the optical disc 335 to linearly polarized beams. A direction of linear polarization in this case is orthogonal to a direction of linear polarization of the laser beams emitted from the three-wavelength semiconductor laser apparatus 100. Thus, the PBS 321 substantially totally reflects the laser beams fed back from the optical disc 335. The objective lens 325 converges the laser beams transmitted through the λ/4 plate 324 on a surface (recording layer) of the optical disc 335. An objective lens actuator (not shown) renders the objective lens 325 movable in a focus direction, a tracking direction and a tilt direction in response to servo signals (a tracking servo signal, a focus servo signal and a tilt servo signal) from the servo circuit described later.

The cylindrical lens 326, the optical axis correction device 327 and the light detection portion 330 are arranged to be along optical axes of the laser beams totally reflected by the PBS 321. The cylindrical lens 326 provides the incident laser beams with astigmatic action. The optical axis correction device 327 is constituted by a diffraction grating and so arranged that spots of zero-order diffracted beams of blue-violet, red and infrared laser beams transmitted through the cylindrical lens 326 coincide with each other on a detection region of the light detection portion 330 described later.

The light detection portion 330 outputs a playback signal on the basis of intensity distribution of the received laser beams. The light detection portion 330 has a detection region of a prescribed pattern, to obtain a focus error signal, a tracking error signal and a tilt error signal along with the playback signal. Thus, the optical pickup 300 comprising the three-wavelength semiconductor laser apparatus 100 is formed.

In this optical pickup 300, the three-wavelength semiconductor laser apparatus 100 can independently emit blue-violet, red and infrared laser beams from the blue-violet semiconductor laser device 20, the red semiconductor laser device 30 and the infrared semiconductor laser device 35 by independently applying voltages between the lead frame 15 and the lead frames 13, 11 and 14, respectively. The laser beams emitted from the three-wavelength semiconductor laser apparatus 100 are adjusted by the PBS 321, the collimator lens 322, the beam expander 323, the λ/4 plate 324, the objective lens 325, the cylindrical lens 326 and the optical axis correction device 327 as described above, and thereafter applied onto the detection region of the light detection portion 330.

When data recorded in the optical disc 335 is play backed, the laser beams emitted from the blue-violet semiconductor laser device 20, the red semiconductor laser device 30 and the infrared semiconductor laser device 35 are controlled to have constant power and applied to the recording layer of the optical disc 335, so that the playback signal outputted from the light detection portion 330 can be obtained. The actuator of the beam expander 323 and the objective lens actuator driving the objective lens 325 can be feedback-controlled by the focus error signal, the tracking error signal and the tilt error signal simultaneously outputted.

When data is recorded in the optical disc 335, the laser beams emitted from the blue-violet semiconductor laser device 20 and the red semiconductor laser device 30 (infrared semiconductor laser device 35) are controlled in power and applied to the optical disc 335, on the basis of the data to be recorded. Thus, the data can be recorded in the recording layer of the optical disc 335. Similarly to the above, the actuator of the beam expander 323 and the objective lens actuator driving the objective lens 325 can be feedback-controlled by the focus error signal, the tracking error signal and the tilt error signal outputted from the light detection portion 330.

Thus, the data can be recorded in or played back from the optical disc 335 with the optical pickup 300 comprising the three-wavelength semiconductor laser apparatus 100.

The optical pickup 300 comprises the three-wavelength semiconductor laser apparatus 100. Thus, the reliable optical pickup 300 capable of stably operating the three-wavelength semiconductor laser apparatus 100 can be obtained.

Although the present invention has been described and illustrated in detail, it is clearly understood that the same is by way of illustration and example only and is not to be taken by way of limitation, the spirit and scope of the present invention being limited only by the terms of the appended claims.

For example, the infrared semiconductor laser device 35 and the red semiconductor laser device 30 may be arranged in this order next to the blue-violet semiconductor laser device 20 in the first embodiment. The red semiconductor laser device 30 may be arranged on the B1 side of the central blue-violet semiconductor laser device 20, and the infrared semiconductor laser device 35 may be arranged on the B2 side of the central blue-violet semiconductor laser device 20 in the second embodiment.

While the blue-violet semiconductor laser device 20 and the two-wavelength semiconductor laser device 40 are bonded onto the submount 50 in a junction-down system in each of the aforementioned first to third embodiments, the present invention is not restricted to this. In the present invention, a junction-up system in which the n-side electrode of each semiconductor laser device is bonded onto the submount 50 may be employed. Alternatively, one of the semiconductor laser devices may be bonded in a junction-down system, and the other of the semiconductor laser devices may be bonded in a junction-up system.

While the two-wavelength semiconductor laser device 40 is monolithically formed in each of the aforementioned first to third embodiments, the present invention is not restricted to this. For example, the red semiconductor laser device 30 and the infrared semiconductor laser device 35 formed separately may be bonded onto the submount 50. In other words, the three semiconductor laser devices including the blue-violet semiconductor laser device 20 are bonded onto the submount 50 adjacent to each other in this case.

While the blue-violet semiconductor laser device 20, the red semiconductor laser device 30 and the infrared semiconductor laser device 35 are employed in each of the aforementioned first to third embodiments, the present invention is not restricted to this. In other words, a semiconductor laser device emitting a laser beam with another lasing wavelength can be employed. For example, an RGB three-wavelength semiconductor laser apparatus as the "semiconductor laser apparatus" in the present invention may be constituted by red, green and blue semiconductor laser devices. Further, each of the semiconductor laser devices may be made of a semiconductor material other than a GaN-based semiconductor, a GaAs-based semiconductor and a GaInP-based semiconductor. Further, three semiconductor laser devices emitting laser beams with the same wavelength may be bonded adjacent to each other.

While the three semiconductor laser devices are bonded onto the submount 50 in each of the aforementioned first to third embodiments, the present invention is not restricted to this, but the semiconductor laser apparatus may be constituted by four or more semiconductor laser devices. In other words, six or more lead terminals may be retained by the base portion.

While the optical pickup 300 comprising the three-wavelength semiconductor laser apparatus 100 has been shown in the aforementioned third embodiment, the present invention is not restricted to this, but the optical pickup may be constituted by the three-wavelength semiconductor laser apparatus 200 according to the second embodiment or the three-wavelength semiconductor laser apparatus 205 according to the modification of the second embodiment.

While the optical pickup 300 has been shown in the aforementioned third embodiment, the present invention is not restricted to this, but the semiconductor laser apparatus in the present invention may be applied to an optical disc apparatus performing record in and playback of an optical disc such as a CD, a DVD or a BD. Further, an RGB three-wavelength semiconductor laser apparatus as the "semiconductor laser apparatus" in the present invention may be constituted by red, green and blue semiconductor laser devices. A projector as the "optical apparatus" in the present invention may be constituted by the aforementioned RGB three-wavelength semiconductor laser apparatus.

What is claimed is:

1. A semiconductor laser apparatus comprising:
a base having a first electrode with a first wire-bonding portion, a second electrode with a second wire-bonding portion, a third electrode with a third wire-bonding portion and a fourth electrode with a fourth wire-bonding portion arranged on an upper surface of said base;
a first semiconductor laser device, a second semiconductor laser device, a third semiconductor laser device and a photodetector arranged on said upper surface; and
a first lead terminal, a second lead terminal, a third lead terminal, a fourth lead terminal and a fifth lead terminal, wherein
said first semiconductor laser device, said second semiconductor laser device and said third semiconductor laser device emit respective laser beams in a first direction,
said first lead terminal, said second lead terminal, said fifth lead terminal, said third lead terminal and said fourth lead terminal extend in said first direction and are arranged in this order along a second direction orthogonal to said first direction,
a first end of said fifth lead terminal in said first direction has a mounting portion for mounting said base,
a third direction is opposite to said first direction,
a fourth direction is opposite to said second direction,
said first lead terminal, said second lead terminal, said third lead terminal and said fourth lead terminal are arranged at positions in said third direction from said mounting portion,
a second end of said first lead terminal in said first direction has a fifth wire-bonding portion,
a fourth end of said second lead terminal in said first direction has a sixth wire-bonding portion,
a fifth end of said third lead terminal in said first direction has a seventh wire-bonding portion,
a third end of said fourth lead terminal in said first direction has an eighth wire-bonding portion,
one electrode of said first semiconductor laser device and a top surface of said photodetector are connected to said first electrode and said second electrode, respectively,
one electrode of said second semiconductor laser device is connected to one electrode of said third electrode or said fourth electrode,
one electrode of said third semiconductor laser device is connected to the other electrode of said third electrode or said fourth electrode,
another electrode of said first semiconductor laser device, another electrode of said second semiconductor laser device, another electrode of said third semiconductor laser device and a lower surface of said photodetector are connected to said fifth lead terminal,
said first wire-bonding portion is arranged at a position in said fourth direction from said first semiconductor laser device and in said first direction from said photodetector,
said second wire-bonding portion is arranged at a position in said fourth direction from said first semiconductor laser device and in said third direction from said first wire-bonding portion,
said third wire-bonding portion is arranged at a position in said second direction from said third semiconductor laser device and in said first direction from said photodetector,
said fourth wire-bonding portion is arranged at a position in said second direction from said third semiconductor laser device and in said third direction from said third wire-bonding portion,
said first wire-bonding portion is connected with said fifth wire-bonding portion through a first wire,
said second wire-bonding portion is connected with said sixth wire-bonding portion through a second wire,
said third wire-bonding portion is connected with said eighth wire-bonding portion through a third wire, and
said fourth wire-bonding portion is connected with said seventh wire-bonding portion through a fourth wire.

2. The semiconductor laser apparatus according to claim 1, wherein
said second end is bent toward said second lead terminal, and
said third end is bent toward said third lead terminal.

3. The semiconductor laser apparatus according to claim 1, wherein
said fifth wire-bonding portion is located at a position in said first direction from said sixth wire-bonding portion, and
said eighth wire-bonding portion is located at a position in said first direction from said seventh wire-bonding portion.

4. The semiconductor laser apparatus according to claim 1, further comprising a base portion retaining said first lead terminal, said second lead terminal, said third lead terminal, said fourth lead terminal and said fifth lead terminal.

5. The semiconductor laser apparatus according to claim 4, wherein
said base portion includes a recess portion in which said mounting portion is arranged.

6. The semiconductor laser apparatus according to claim 5, wherein
on a bottom surface of said recess portion, said second end is bent toward said second lead terminal, and
on said bottom surface of said recess portion, said third end is bent toward said third lead terminal.

7. The semiconductor laser apparatus according to claim 2, wherein
said fourth end and said fifth end are bent toward said first end.

8. The semiconductor laser apparatus according to claim 1, wherein
said base has a substantially rectangular shape in plan view, and
said first wire-bonding portion, said second wire-bonding portion, said third wire-bonding portion and said fourth wire-bonding portion are separately arranged in the vicinity of corners of said base.

9. The semiconductor laser apparatus according to claim 4, wherein
a maximum width of said base portion in said second direction is smaller than a maximum width from said first lead terminal to said fourth lead terminal in said second direction.

10. The semiconductor laser apparatus according to claim 4, wherein
a maximum width of said base portion in said second direction is larger than a maximum width from said first lead terminal to said fourth lead terminal in said second direction.

11. The semiconductor laser apparatus according to claim 1, wherein said fifth wire-bonding portion is located at a position in said fourth direction from said sixth wire-bonding portion, and said eighth wire-bonding portion is located at a position in said second direction from said seventh wire-bonding portion.

12. The semiconductor laser apparatus according to claim 1, wherein said fifth wire-bonding portion is located at a position in said fourth direction from said first wire-bonding portion, and said eighth wire-bonding portion is located at a position in said second direction from said third wire-bonding portion.

13. The semiconductor laser apparatus according to claim 1, wherein said sixth wire-bonding portion is located at a position in said fourth direction from said second wire-bonding portion, and said seventh wire-bonding portion is located at a position in said second direction from said fourth wire-bonding portion.

14. The semiconductor laser apparatus according to claim 4, wherein said fifth lead terminal further has heat radiation portions extending outward from said base portion.

15. The semiconductor laser apparatus according to claim 14, wherein said heat radiation portions are seamlessly connected to sides of said mounting portion in said second direction and said fourth direction.

16. The semiconductor laser apparatus according to claim 1, wherein said one electrode of said second semiconductor laser device is connected to said fourth electrode.

17. The semiconductor laser apparatus according to claim 1, wherein said photodetector is embedded in said base, and a photosensitive surface of said photodetector is arranged on said upper surface of said base.

18. The semiconductor laser apparatus according to claim 17, further comprising an insulating film surrounding said photodetector on said upper surface, wherein said second electrode crosses said insulating film and said photosensitive surface.

19. A semiconductor laser apparatus comprising:

a base having a first electrode with a first wire-bonding portion, a second electrode with a second wire-bonding portion, a third electrode with a third wire-bonding portion and a fourth electrode with a fourth wire-bonding portion arranged on an upper surface of said base;

a first semiconductor laser device, a second semiconductor laser device, a third semiconductor laser device and a photodetector arranged on said upper surface; and a first lead terminal, a second lead terminal, a third lead terminal, a fourth lead terminal and a fifth lead terminal, wherein said first semiconductor laser device, said second semiconductor laser device and said third semiconductor laser device emit respective laser beams in a first direction, said first lead terminal, said second lead terminal, said fifth lead terminal, said third lead terminal and said fourth lead terminal extend in said first direction and are arranged in this order along a second direction orthogonal to said first direction, a first end of said fifth lead terminal in said first direction has a mounting portion for mounting said base, a third direction is opposite to said first direction, a fourth direction is opposite to said second direction, said first lead terminal, said second lead terminal, said third lead terminal and said fourth lead terminal are arranged at positions in said third direction from said mounting portion, a second end of said first lead terminal in said first direction has a fifth wire-bonding portion, a fourth end of said second lead terminal in said first direction has a sixth wire-bonding portion, a fifth end of said third lead terminal in said first direction has a seventh wire-bonding portion, a third end of said fourth lead terminal in said first direction has an eighth wire-bonding portion, one electrode of said first semiconductor laser device and a top surface of said photodetector are connected to said first electrode and said second electrode, respectively, one electrode of said second semiconductor laser device is connected to one electrode of said third electrode or said fourth electrode, one electrode of said third semiconductor laser device is connected to the other electrode of said third electrode or said fourth electrode, another electrode of said first semiconductor laser device, another electrode of said second semiconductor laser device, another electrode of said third semiconductor laser device and a lower surface of said photodetector are connected to said fifth lead terminal, said first wire-bonding portion is arranged at a position in said fourth direction from said first semiconductor laser device and in said first direction from said photodetector, said second wire-bonding portion is arranged on said photodetector in said fourth direction and in said third direction from said first wire-bonding portion or at a position outside said photodetector in said fourth direction and in said third direction from said first wire-bonding portion, said third wire-bonding portion is arranged at a position in said second direction from said third semiconductor laser device and in said first direction from said photodetector, said fourth wire-bonding portion is arranged at a position in said second direction from said photodetector and in said third direction from said third wire-bonding portion, said first wire-bonding portion is connected with said fifth wire-bonding portion through a first wire, said second wire-bonding portion is connected with said sixth wire-bonding portion through a second wire, said third wire-bonding portion is connected with said eighth wire-bonding portion through a third wire, and said fourth wire-bonding portion is connected with said seventh wire-bonding portion through a fourth wire.

20. An optical apparatus comprising:

a semiconductor laser apparatus including a base having a first electrode with a first wire-bonding portion, a second electrode with a second wire-bonding portion, a third electrode with a third wire-bonding portion and a fourth electrode with a fourth wire-bonding portion arranged on an upper surface of said base, a first semiconductor laser device, a second semiconductor laser device, a third semiconductor laser device and a photodetector arranged on said upper surface, and a first lead terminal, a second lead terminal, a third lead terminal, a fourth lead terminal and a fifth lead terminal; and an optical system controlling a beam emitted from said semiconductor laser apparatus, wherein said first semiconductor laser device, said second semiconductor laser device and said third semiconductor laser device emit respective laser beams in a first direction, said first lead terminal, said second lead terminal, said fifth lead terminal, said third lead terminal and said fourth lead terminal extend in said first direction and are arranged in this order along a second direction orthogonal to said first direction, a first end of said fifth lead terminal in said first direction has a mounting portion for mounting said base, a third direction is opposite to said first direction, a fourth direction is opposite to said second direction, said first lead terminal, said second lead terminal, said third lead terminal and said fourth lead terminal are arranged at positions in said third direction from said mounting portion, a second end of said first lead terminal in said first direction has a fifth wire-bonding portion, a fourth end of said second lead terminal in said first direction has a sixth wire-bonding portion, a fifth end of said third lead terminal in said first direction has a seventh wire-bonding portion, a third end of said fourth lead terminal in said first direction has an eighth wire-bonding portion, one electrode of said first semiconductor laser device and a top surface of said photodetector are connected to said first electrode and said second electrode, respectively, one electrode of said second semiconductor laser device is connected to one electrode of said third electrode or said fourth electrode, one electrode of said third semiconductor laser device is connected to the other electrode of said third electrode or said fourth electrode, another electrode of said first semiconductor laser device, another electrode of said second semiconductor laser device, another electrode of said third semiconductor laser device and a lower surface of said photodetector are connected to said fifth lead terminal, said first wire-bonding portion is arranged at a position in said fourth direction from said first semiconductor laser device and in said first direction from said photodetector, said second wire-bonding portion is arranged at a position in said fourth direction from said first semiconductor laser device and in said third direction from said first wire-bonding portion, said third wire-bonding portion is arranged at a position in said second direction from said third semiconductor laser device and in said first direction from said photodetector, said fourth wire-bonding portion is arranged at a position in said second direction from said third semiconductor laser device and in said third direction from said third wire-bonding portion, said first wire-bonding portion is connected with said fifth wire-bonding portion through a first wire, said second wire-bonding portion is connected with said sixth wire-bonding portion through a second wire, said third wire-bonding portion is connected with said eighth wire-bonding portion through a third wire, and said fourth wire-bonding portion is connected with said seventh wire-bonding portion through a fourth wire.

* * * * *